United States Patent
Lee et al.

(10) Patent No.: US 8,987,867 B2
(45) Date of Patent: Mar. 24, 2015

(54) WAFER AND METHOD OF MANUFACTURING THE SAME

(71) Applicant: Samsung Electronics Co., Ltd., Suwon-si, Gyeonggi-do (KR)

(72) Inventors: Ji Hyun Lee, Seongnam (KR); Jong Hyoung Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/078,866

(22) Filed: Nov. 13, 2013

(65) Prior Publication Data

US 2014/0131840 A1    May 15, 2014

(30) Foreign Application Priority Data

Nov. 14, 2012 (KR) .......... 10-2012-0128938

(51) Int. Cl.
| | |
|---|---|
| *H01L 23/544* | (2006.01) |
| *H01L 21/00* | (2006.01) |
| *H01L 21/71* | (2006.01) |
| *H01L 27/02* | (2006.01) |

(52) U.S. Cl.
CPC ............ *H01L 21/71* (2013.01); *H01L 27/0207* (2013.01)
USPC .......................................... 257/620; 438/462

(58) Field of Classification Search
CPC ......... H01L 21/71; H01L 21/77; H01L 27/06; H01L 27/0207
USPC ........................... 257/620; 438/400, 460, 462
See application file for complete search history.

(56) References Cited

U.S. PATENT DOCUMENTS

| | | | | |
|---|---|---|---|---|
| 5,024,970 | A * | 6/1991 | Mori ............................. | 438/462 |
| 6,365,958 | B1 * | 4/2002 | Ibnabdeljalil et al. ........ | 257/620 |
| 6,605,861 | B2 * | 8/2003 | Toyoda ......................... | 257/620 |
| 6,838,299 | B2 * | 1/2005 | Mulligan et al. ................ | 438/33 |
| 7,888,777 | B2 * | 2/2011 | Hayasaki ...................... | 257/620 |
| 8,125,053 | B2 * | 2/2012 | West et al. ................... | 257/620 |
| 2004/0097051 | A1 * | 5/2004 | Wu et al. ...................... | 438/400 |
| 2005/0184362 | A1 * | 8/2005 | Fujita ........................... | 257/620 |
| 2009/0057842 | A1 * | 3/2009 | He et al. ...................... | 257/620 |
| 2010/0013059 | A1 * | 1/2010 | Hsieh et al. .................. | 257/620 |

* cited by examiner

*Primary Examiner* — Nikolay Yushin
(74) *Attorney, Agent, or Firm* — Lee & Morse, P.C.

(57) ABSTRACT

A wafer includes a first die, a second die, and a scribe lane located between the first die and the second die. The scribe lane includes a first doped silicon region, and does not directly contact the first die and the second die.

16 Claims, 14 Drawing Sheets

WAFER AND METHOD OF MANUFACTURING THE SAME

CROSS-REFERENCE TO RELATED APPLICATION

Korean Patent Application No. 10-2012-0128938, filed on Nov. 14, 2012, in the Korean Intellectual Property Office, and entitled: "Wafer and Method of Manufacturing the Same," is incorporated by reference herein in its entirety.

BACKGROUND

1. Field

Example embodiments relate to semiconductor wafers, and more particularly, to a wafer including dies separated from each other by scribe lanes, and a method of manufacturing the wafer.

2. Description of the Related Art

A wafer is a slice formed of a semiconductor material. The wafer includes dies formed of semiconductor elements or devices. The wafer is designed such that the dies are separated from one another by scribe lanes.

SUMMARY

Embodiments are directed to a wafer including a first die, a second die, and a scribe lane located between the first die and the second die. The scribe lane includes a first doped silicon region, and the first doped silicon region and does not directly contact the first die and the second die. The first doped region may not be isolated from oxidized silicon.

The first doped silicon region may be n-type silicon or p-type silicon. A region remaining after excepting the first doped silicon region from the scribe lane may be an undoped silicon region.

The first doped silicon region and the undoped silicon region may alternate with each other. The first doped silicon region may be formed in the same direction as a direction in which a sawing blade passes. In some cases, the scribe lane may further include a second doped silicon region. The first doped silicon region and the second doped silicon region may each be formed of n-type silicon or p-type silicon.

The first doped silicon region and the second doped silicon region may be adjacent to each other. The first doped silicon region and the second doped silicon region may be formed in a checkerboard pattern. The first doped silicon region and the second doped silicon region may alternate with each other.

Embodiments are also directed to a method of manufacturing a wafer including forming a first die and a second die on a semiconductor substrate, the first die and the second die being separated from each other by the scribe lane, forming a first doped silicon region in a scribe lane, and forming a second doped silicon region of a different silicon type from a silicon type of the first doped silicon region in the scribe lane. The.

When the first doped silicon region is formed of n-type silicon, the second doped silicon region may be formed of p-type silicon. When the first doped silicon region is formed of p-type silicon, the second doped silicon region may be formed of n-type silicon. The first doped silicon region may be formed to not be isolated from oxidized silicon. The first doped silicon region may be formed to not directly contact the first die and the second die.

Embodiments are also directed to a wafer including a first die, a second die, and a scribe lane located between the first die and the second die. The scribe lane includes a substrate region including a doped silicon region and an undoped silicon region, the undoped silicon region being present between the doped silicon region and the first die and the second die such that the doped silicon region does not directly contact the first die or the second die, and a passivation region above the substrate region.

The scribe lane may include a sawing blade passing region. The doped silicon region is present in the sawing blade passing region. The doped silicon region may be made of n-type silicon or p-type silicon.

The doped silicon region may include a first doped silicon region of n-type silicon and a second doped region of p-type silicon.

The doped silicon region may include a plurality of first doped silicon regions and second doped regions that contact each other.

The doped silicon region may include a plurality of first doped silicon regions and second doped regions that are separated from each other by the undoped silicon region.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
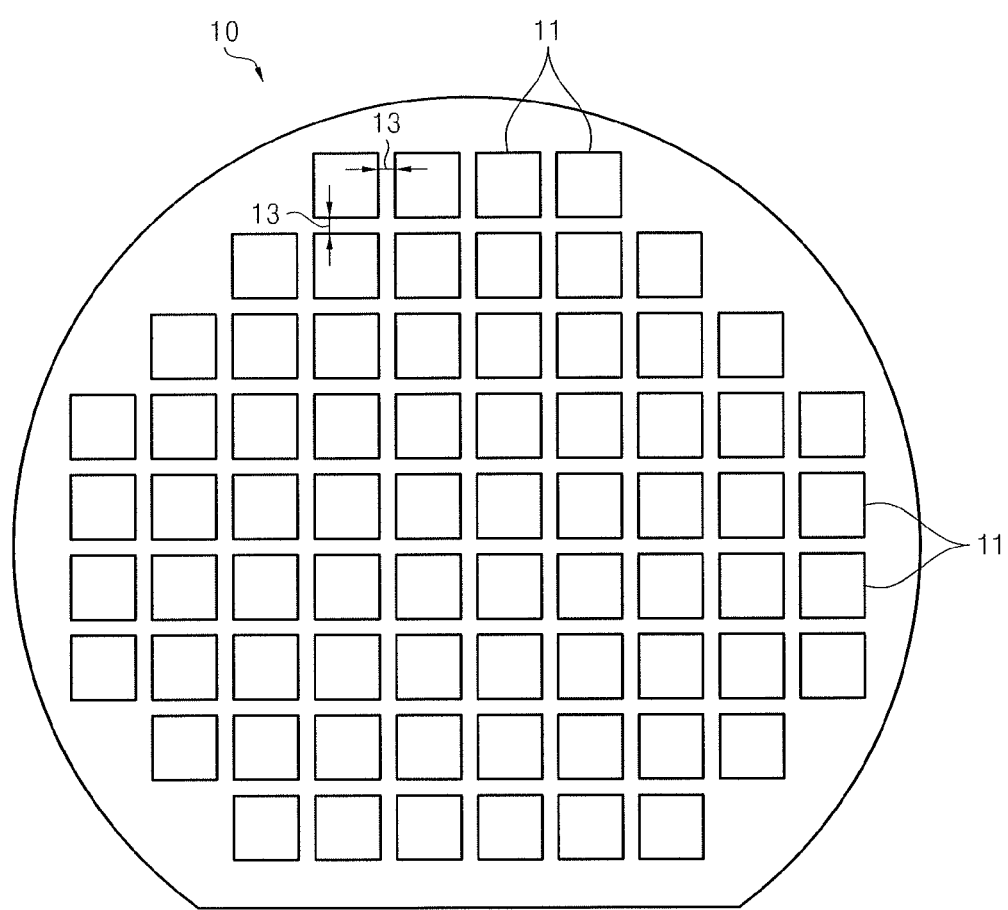
FIG. 1 illustrates a diagram of a wafer including scribe lanes.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a diagram of a wafer 10 including a scribe lane 13. Referring to FIG. 1, the wafer 10 may include a plurality of dies 11. Each of the dies 11 may include an integrated circuit. The dies 11 are separated from each other by the scribe lane 13. The scribe lane 13 may be a wide lane that crosses the wafer 10 horizontally and vertically.

Figure 2:
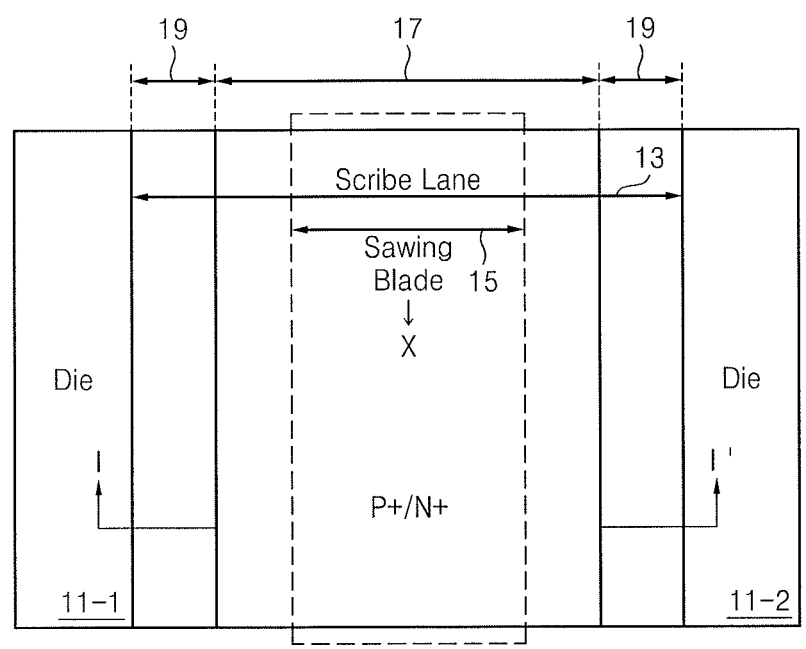
FIG. 2 illustrates a diagram of a scribe lane according to an embodiment.

FIG. 2 illustrates a diagram of a scribe lane 13 according to an embodiment. Referring to FIGS. 1 and 2, first and second dies 11-1 and 11-2 are spaced apart from each other by the scribe lane 13.

Each of the first and second dies 11-1 and 11-2 of FIG. 2 illustrates corresponding one of the dies 11 of FIG. 1. The scribe lane 13 includes a first doped silicon region 17. The first doped silicon region 17 may be formed to not be isolated by oxidized silicon (for example, silicon dioxide).

The first doped silicon region 17 may be formed of n-type silicon or p-type silicon. The first doped silicon region 17 may be formed in the same direction as a direction X in which a sawing blade (not shown) passes. The sawing blade may be used to perform a dicing process. The sawing blade may be the scribe lane 13 as a cutting line. During the dicing process, charges may be produced.

The first doped silicon region 17 formed in the scribe lane 13 may be used to absorb charges generated during the dicing process. The first doped silicon region 17 may absorb charges produced during the dicing process, and thus may be used to prevent or reduce the likelihood of electrostatic damage due to the charges produced during the dicing process.

For example, when the charges produced or generated during the dicing process are negative charges, the first doped silicon region 17 doped with p-type silicon may be used to absorb the negative charges. On the other hand, when the charges produced during the dicing process are positive charges, the first doped silicon region 17 doped with n-type silicon may be used to absorb the positive charges.

A sawing blade region 15 is a region where the sawing blade passes. The sawing blade region 15 is included in the scribe lane 13. A region 19 remaining after excepting the first doped silicon region 17 from the scribe lane 13 may be an undoped silicon region. Accordingly, the first doped silicon region 17 does not directly contact the first die 11-1 and the second die 11-2.

Figure 3:
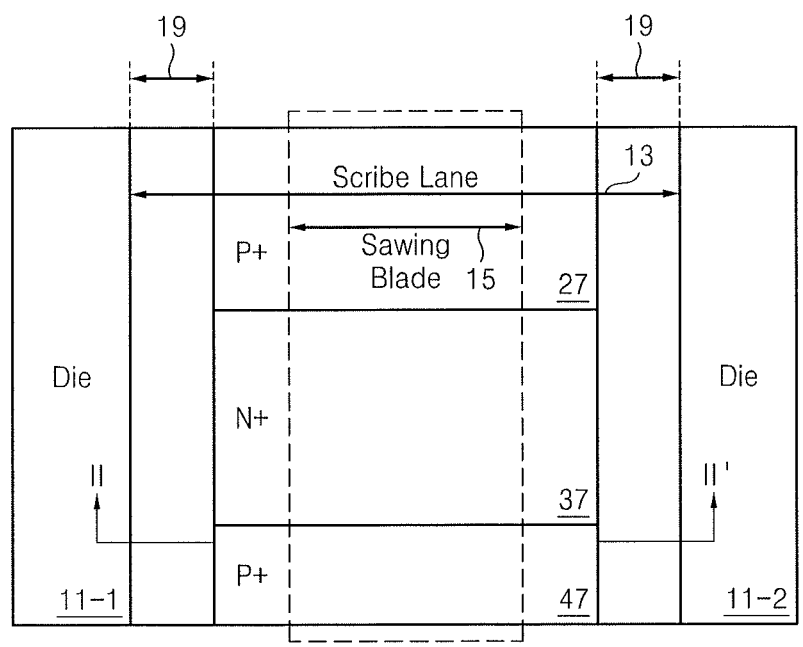
FIG. 3 illustrates a diagram of a scribe lane according to another embodiment.

FIG. 3 illustrates a diagram of a scribe lane 13 according to another embodiment. Referring to FIGS. 1 and 3, dies 11-1 and 11-2 are separated from each other by the scribe lane 13. The scribe lane 13 may include a first doped silicon region 27, a second doped silicon region 37, and a third doped silicon region 47.

The first, second, and third doped silicon region 27, 37, and 47 formed in the scribe lane 13 may be used to absorb charges produced during a dicing process.

For example, the first doped silicon region 27 and the third doped silicon region 47 may be formed of p-type silicon. The second doped silicon region 37 may be formed of n-type silicon. Accordingly, the first doped silicon region 27 and the third doped silicon region 47 may absorb negative charges produced during the dicing process. The second doped silicon region 37 may absorb positive charges produced during the dicing process.

The first doped silicon region 27, the second doped silicon region 37, and the third doped silicon region 47 are adjacent to one another. A region 19 remaining after excepting the first, second, and third doped silicon regions 27, 37, and 47 may be an undoped silicon region. A sawing blade region 15 is a region where the sawing blade passes, and the sawing blade region 15 is included in the scribe lane 13.

Figure 4:
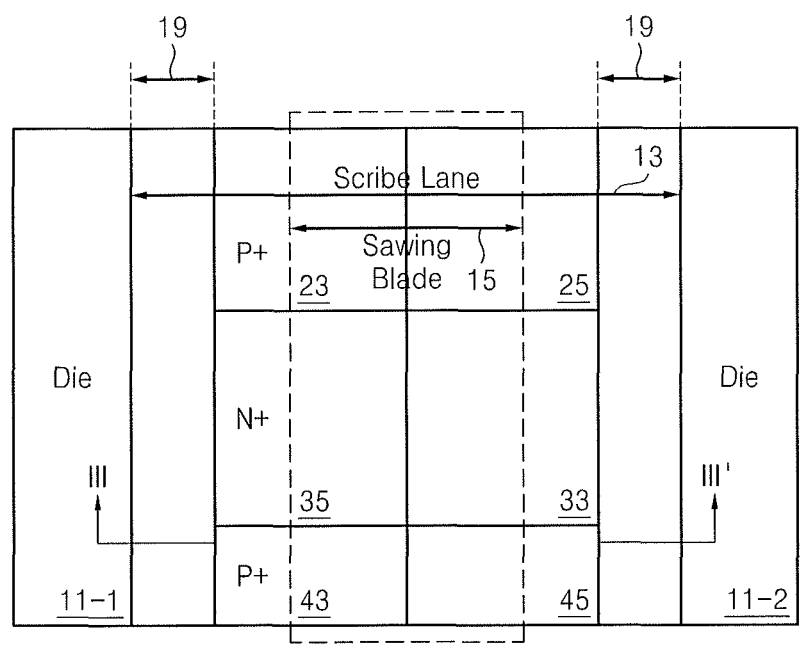
FIG. 4 illustrates a diagram of a scribe lane according to another embodiment.

FIG. 4 illustrates a diagram of a scribe lane 13 according to another embodiment. Referring to FIGS. 1 and 4, the scribe lane 13 may include doped silicon regions 23, 25, 33, 35, 43, and 45. The doped silicon regions 23, 25, 33, 35, 43, and 45 may be formed to have a checkerboard pattern.

For example, the doped silicon regions 23, 33, and 43 may each be formed of p-type silicon. The doped silicon regions 25, 35, and 45 may each be formed of n-type silicon. Accordingly, each of the doped silicon regions 23, 33, and 43 may absorb negative charges produced during the dicing process. Each of the doped silicon regions 25, 35, and 45 may absorb positive charges produced during the dicing process.

Since the structures and functions of components 11-1, 11-2, 15, and 19 except the doped silicon regions 23, 25, 33, 35, 43, and 45 of FIG. 4 are substantially the same as those of the components 11-1, 11-2, 15 and 19 of FIG. 3, respectively, a detailed description thereof will not be repeated.

Figure 5:
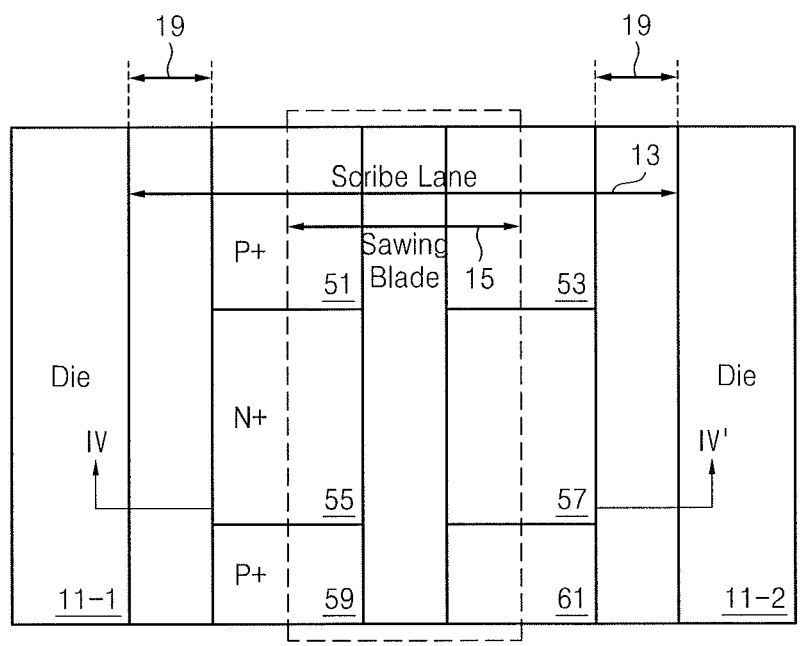
FIG. 5 illustrates a diagram of a scribe lane according to another embodiment.

FIG. 5 illustrates a diagram of a scribe lane 13 according to another embodiment. Referring to FIGS. 1 and 5, the scribe lane 13 may include doped silicon regions 51, 53, 55, 57, 59, and 61. The doped silicon regions 51, 55, and 59 may be adjacent to one another, and the doped silicon regions 53, 57, and 61 may be adjacent to one another. The doped silicon regions 51, 55, and 59 may be separated from the doped silicon regions 53, 57, and 61.

For example, the doped silicon regions 51, 53, 59, and 61 may be each formed of p-type silicon. The doped silicon regions 55 and 57 may be each formed of n-type silicon. Accordingly, each of the doped silicon regions 51, 53, 59, and 61 may absorb negative charges produced during the dicing process. Each of the doped silicon regions 55 and 57 may absorb positive charges produced during the dicing process.

Since the structures and functions of components 11-1, 11-2, 15, and 19 except the doped silicon regions 51, 53, 55, 57, 59, and 61 of FIG. 5 are substantially the same as those of the components 11-1, 11-2, 15 and 19 of FIG. 3, respectively, a detailed description thereof will not be repeated.

Figure 6:
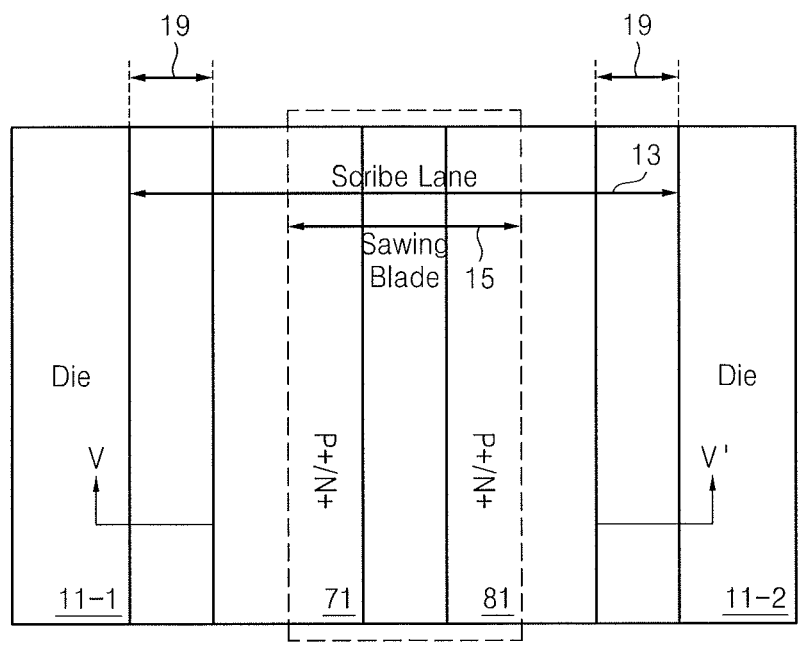
FIG. 6 illustrates a diagram of a scribe lane according to another embodiment.

FIG. 6 illustrates a diagram of a scribe lane 13 according to another embodiment. Referring to FIGS. 1 and 6, the scribe lane 13 may include first and second doped silicon regions 71 and 81 and an undoped silicon region 19. The first doped silicon region 71 may be separated from the second doped silicon region 81. The first doped silicon region 71 and the undoped silicon region 19 may alternate with each other. The first doped silicon region 71 or the second doped silicon region 81 may be p-type silicon or n-type silicon.

Since the structures and functions of components 11-1, 11-2, 15, and 19 except the first and second doped silicon regions 71 and 81 of FIG. 6 are substantially the same as those of the components 11-1, 11-2, 15 and 19 of FIG. 3, respectively, a detailed description thereof not be repeated.

Figure 7:
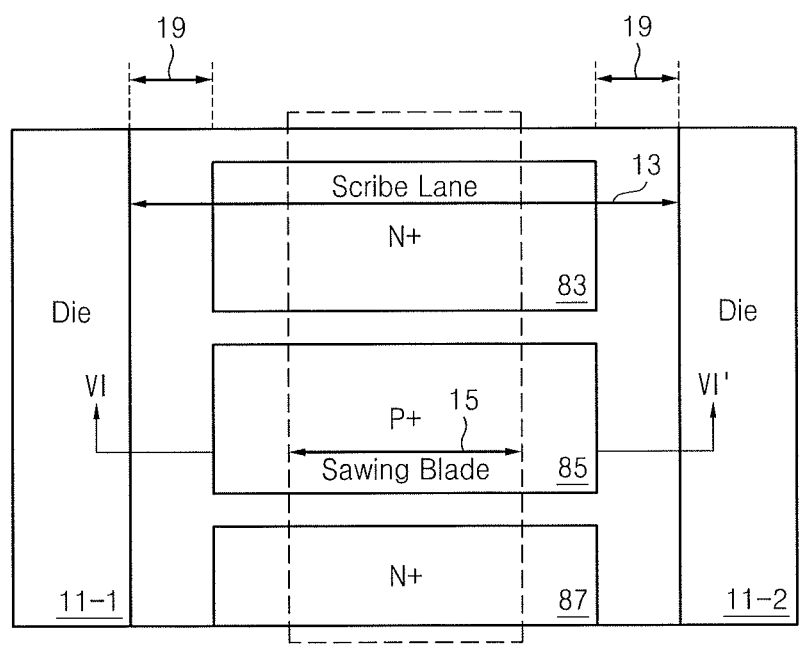
FIG. 7 illustrates a diagram of a scribe lane according to another embodiment.

FIG. 7 illustrates a diagram of a scribe lane 13 according to another embodiment. Referring to FIGS. 1 and 7, the scribe lane 13 may include first, second, and third doped silicon regions 83, 85, and 87. The first, second, and third doped silicon regions 83, 85, and 87 may be separated from one another. For example, the first doped silicon region 83 and the third doped silicon region 87 may be each formed of n-type silicon, and the second doped silicon region 85 may be formed of p-type silicon.

Figure 8:
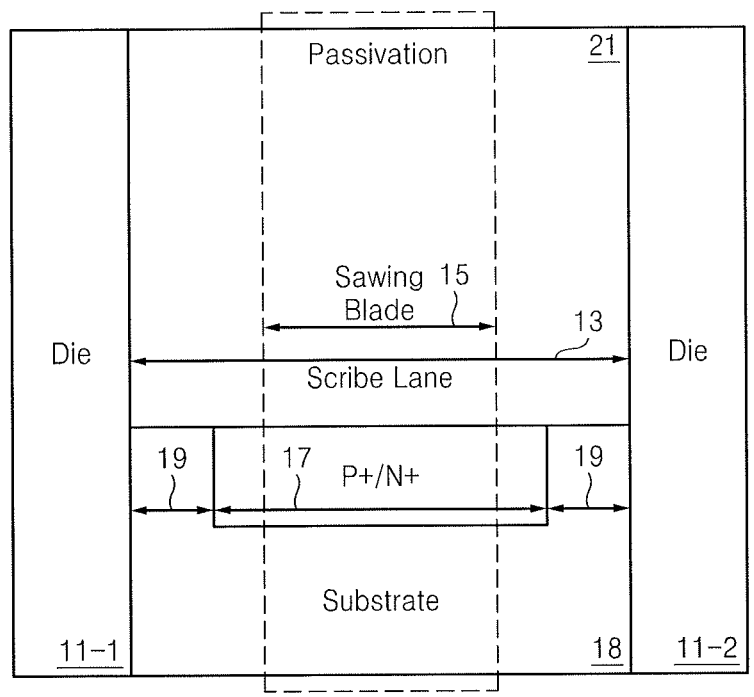
FIG. 8 illustrates a cross-sectional view of the scribe lane taken along line I-I' illustrated in FIG. 2.

Since the structures and functions of components 11-1, 11-2, 15, and 19 except the first, second, and third doped silicon regions 83, 85, and 87 of FIG. 7 are substantially the same as those of the components 11-1, 11-2, 15, and 19 of FIG. 3, respectively, a detailed description thereof not be repeated FIG. 8 illustrates a cross-sectional view of the scribe lane 13 taken along line I-I' of FIG. 2. Referring to FIGS. 2 and 8, a substrate 18 may include the first doped silicon region 17 and the undoped silicon region 19. The substrate 18 may be a silicon substrate. The first doped silicon region 17 may be formed of n-type silicon or p-type silicon. Accordingly, the first doped silicon region 17 may absorb positive or negative charges produced by sawing. Thus, damage due to sawing may be reduced or prevented.

A passivation layer 21 is located above the substrate 18. The passivation layer 21 may be formed of oxide. The first doped silicon region 17 is formed to not directly contact the first die 11-1 and the second die 11-2.

Figure 9:
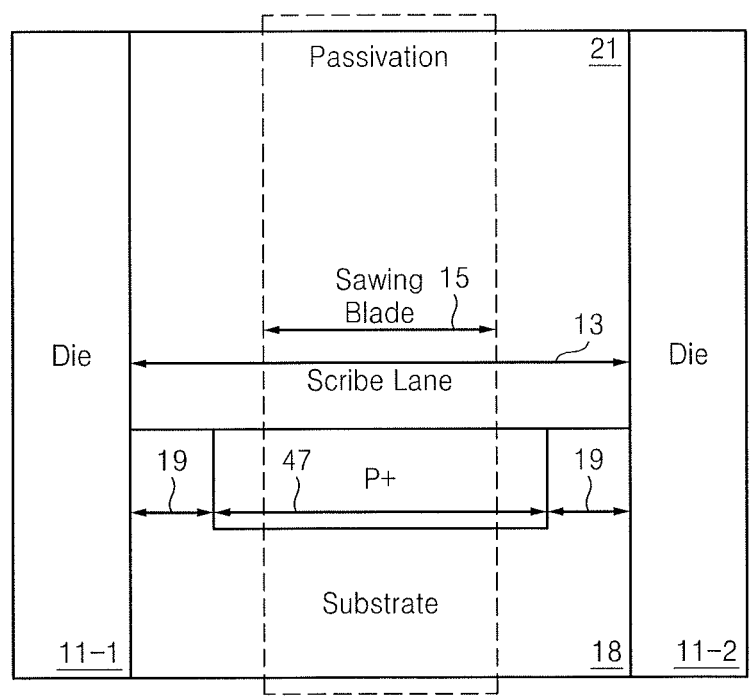
FIG. 9 illustrates a cross-sectional view of the scribe lane taken along line II-II' illustrated in FIG. 3.

FIG. 9 illustrates a cross-sectional view of the scribe lane 13 taken along line II-IP illustrated in FIG. 3. Referring to FIGS. 3 and 9, a substrate 18 may include the third doped silicon region 47. The third doped silicon region 47 may be formed of p-type silicon. The third doped silicon region 47 may absorb negative charges produced by sawing.

Since the structures and functions of components 11-1, 11-2, and 21 except the third doped silicon region 47 of FIG. 9 are substantially the same as those of the components 11-1, 11-2, and 21 of FIG. 8, respectively, a detailed description thereof will not be repeated.

Figure 10:
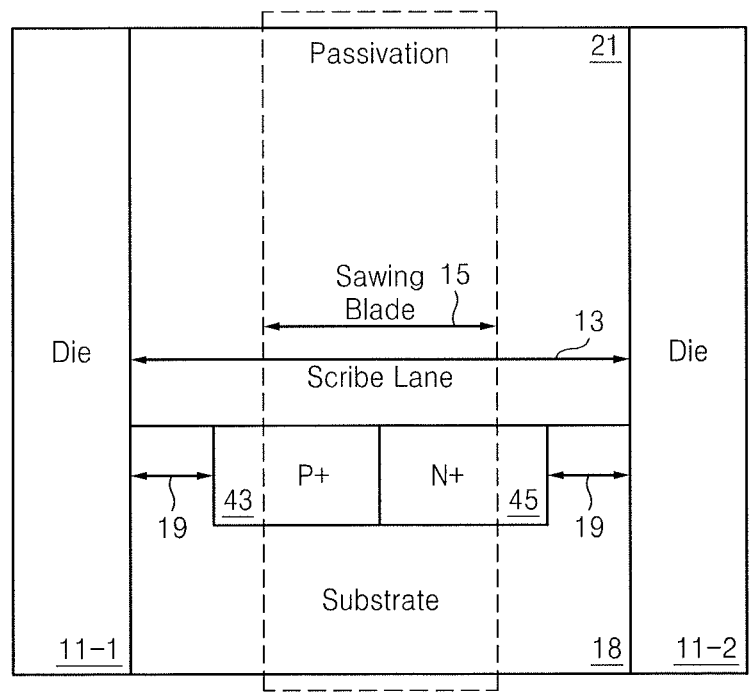
FIG. 10 illustrates a cross-sectional view of the scribe lane taken along line III-III' illustrated in FIG. 4.

FIG. 10 illustrates a cross-sectional view of the scribe lane 13 taken along line illustrated in FIG. 4. Referring to FIGS. 4 and 10, a substrate 18 may include the doped silicon regions 43 and 45. The doped silicon region 43 may be formed of p-type silicon, and the doped silicon region 45 may be formed of n-type silicon. Accordingly, the doped silicon region 43 may absorb negative charges produced by sawing, and the doped silicon region 45 may absorb positive charges produced by sawing.

Since the structures and functions of components 11-1, 11-2, and 21 except the doped silicon regions 43 and 45 of FIG. 10 are substantially the same as those of the components 11-1, 11-2, and 21 of FIG. 8, respectively, a detailed description thereof will not be repeated.

Figure 11:
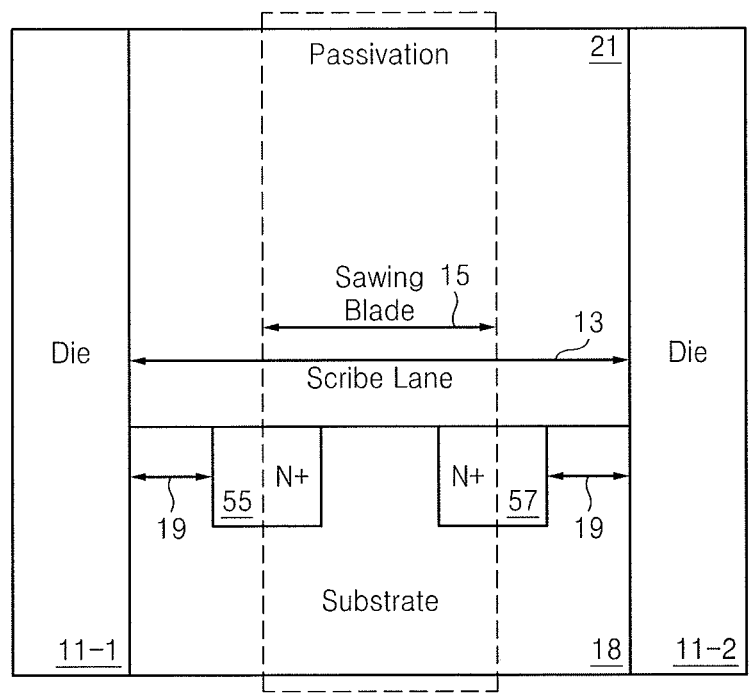
FIG. 11 illustrates a cross-sectional view of the scribe lane taken along line IV-IV' illustrated in FIG. 5.

FIG. 11 illustrates a cross-sectional view of the scribe lane 13 taken along line IV-IV' illustrated in FIG. 5. Referring to FIGS. 5 and 11, a substrate 18 may include the doped silicon regions 55 and 57. The doped silicon regions 55 and 57 may be each formed of n-type silicon. Thus, the doped silicon region 55 and 57 may absorb positive charges produced by sawing.

Since the structures and functions of components 11-1, 11-2, and 21 except the doped silicon regions 55 and 57 of FIG. 11 are substantially the same as those of the components 11-1, 11-2, and 21 of FIG. 8, respectively, a detailed description thereof will not be repeated.

Figure 12:
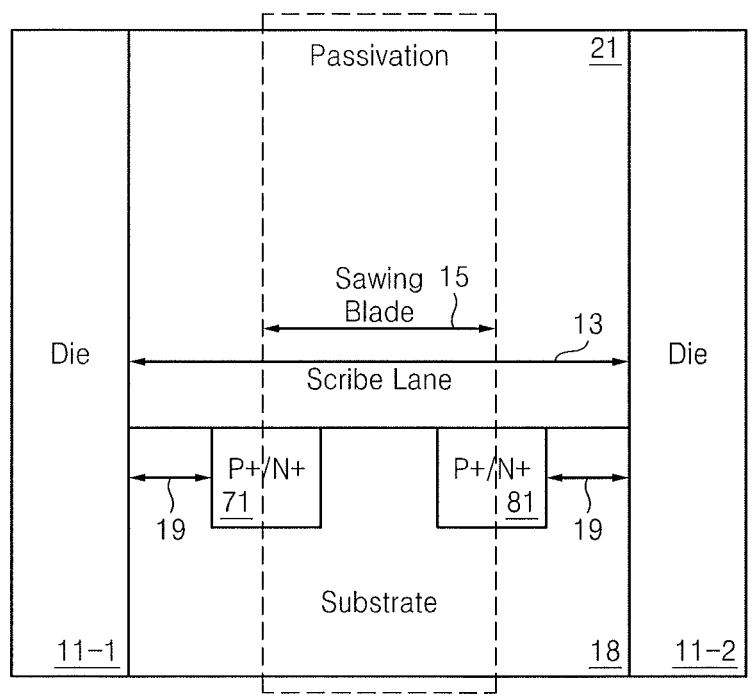
FIG. 12 illustrates a cross-sectional view of the scribe lane taken along line V-V' illustrated in FIG. 6.

FIG. 12 illustrates a cross-sectional view of the scribe lane 13 taken along line V-V' illustrated in FIG. 6. Referring to FIGS. 6 and 12, a substrate 18 may include the first and second doped silicon regions 71 and 81. Each of the first and second doped silicon regions 71 and 81 may be formed of n-type silicon or p-type silicon. Thus, the first and second doped silicon regions 71 and 81 may absorb positive or negative charges produced by sawing.

Since the structures and functions of components 11-1, 11-2, and 21 except the first and second doped silicon regions 71 and 81 of FIG. 12 are substantially the same as those of the components 11-1, 11-2, and 21 of FIG. 8, respectively, a detailed description thereof will not be repeated.

Figure 13:
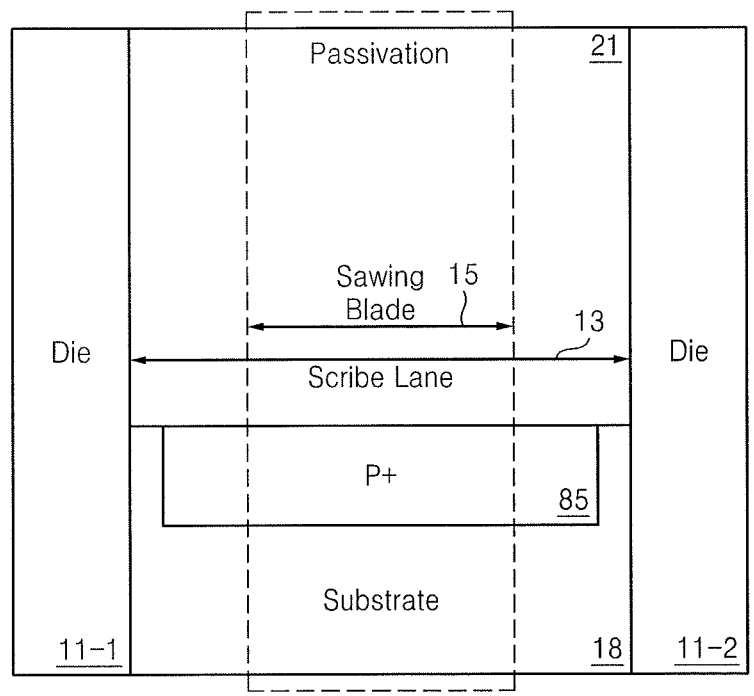
FIG. 13 illustrates a cross-sectional view of the scribe lane taken along line VI-VI' illustrated in FIG. 7.

FIG. 13 illustrates a cross-sectional view of the scribe lane 13 taken along line VI-VI' illustrated in FIG. 7. Referring to FIGS. 7 and 13, a substrate 18 may include the second doped silicon region 85. The second doped silicon region 85 may be formed of p-type silicon. Thus, the second doped silicon region 85 may absorb negative charges.

Since the structures and functions of components 11-1, 11-2, and 21 except the second doped silicon region 85 of FIG. 13 are substantially the same as those of the components 11-1, 11-2, and 21 of FIG. 8, respectively, a detailed description thereof will not be repeated.

Figure 14:
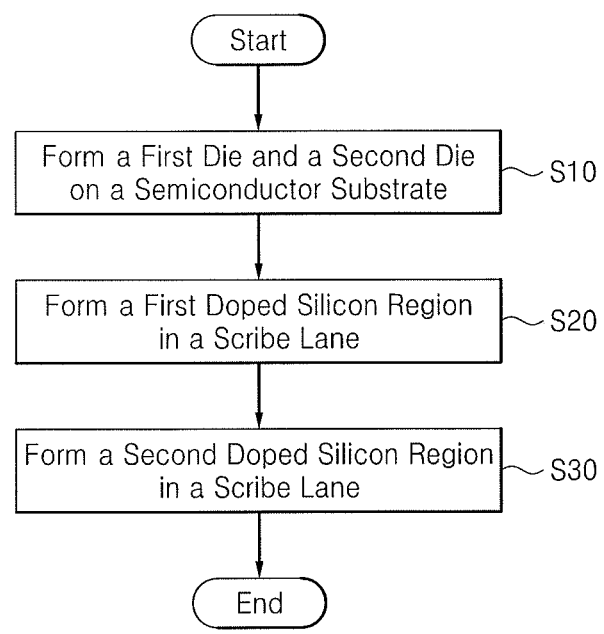
FIG. 14 illustrates a flowchart of a method of manufacturing a wafer, according to an embodiment.

FIG. 14 illustrates a flowchart of a method of manufacturing a wafer, according to an embodiment.

Referring to FIGS. 1, 2, and 14, the first die 11-1 and the second die 11-2 may be formed on or in a semiconductor substrate, in operation S10. The first die 11-1 is separated from the second die 11-2 by the scribe lane 13.

In operation S20, the first doped silicon region 17 may be formed on or in the scribe lane 13. The first doped silicon region 17 may be formed of n-type silicon or p-type silicon. The first doped silicon region 17 may be formed not to be isolated from (or by) oxidized silicon. The first doped silicon region 17 is formed to not directly contact the first die 11-1 and the second die 11-2.

In some cases, in operation S30, a second doped silicon region (not shown) may be formed in the scribe lane 13. The second doped silicon region may be doped with a silicon type different from a silicon type used to dope the first doped silicon region 17. For example, when the first doped silicon region 17 is formed of n-type silicon, the second doped silicon region may be formed of p-type silicon.

The second doped silicon region is also formed not to be isolated from (or by) a silicon region or oxidized silicon. The second doped silicon region is also formed to not directly contact the first die 11-1 and the second die 11-2. A doped silicon region may be formed in the scribe lane 13 to absorb charges produced by sawing.

By way of summation and review, a sawing or dicing process is performed on a wafer in order to separate the dies from one another. During the sawing or dicing process, a saw uses scribe lanes as cutting lines. During the sawing or dicing process, charges may be generated, and there is a risk that a semiconductor device or an element could be damaged by the charges.

In a wafer and a method of manufacturing the wafer according to an embodiment, a doped silicon region is formed on or in a scribe lane, thereby preventing or reducing damage to a semiconductor element (or device) due to charges produced during a dicing process for separating a plurality of chips formed within the wafer from one another.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wafer, comprising:
    a first die;
    a second die; and
    a scribe lane located between the first die and the second die,
    wherein the scribe lane includes a first doped silicon region and a second doped silicon region that do not directly contact the first die and the second die, the first doped silicon region and the second doped silicon region being respectively formed of n-type silicon and p-type silicon.

2. The wafer as claimed in claim 1, wherein the first doped silicon region is not isolated from oxidized silicon.

3. The wafer as claimed in claim 1, wherein a region of the scribe lane remaining after excepting the first doped silicon region and the second doped silicon region from the scribe lane is an undoped silicon region.

4. The wafer as claimed in claim 3, wherein the first doped silicon region, the second doped silicon region, and the undoped silicon region alternate with each other.

5. The wafer as claimed in claim 1, wherein the first doped silicon region is formed in a same direction as a direction in which a sawing blade passes.

6. The wafer as claimed in claim 1, wherein the first doped silicon region and the second doped silicon region are adjacent to each other.

7. The wafer as claimed in claim 1, wherein the first doped silicon region and the second doped silicon region are formed in a checkerboard pattern.

8. The wafer as claimed in claim 1, wherein the first doped silicon region and the second doped silicon region alternate with each other.

9. A method of manufacturing a wafer, the method comprising:
    forming a first die and a second die on a semiconductor substrate, wherein the first die and the second die are separated from each other by a scribe lane;
    forming a first doped silicon region in the scribe lane; and
    forming a second doped silicon region of a different silicon type from a silicon type of the first doped silicon region in the scribe lane.

10. The method as claimed in claim 9, wherein one of the first doped silicon region and the second doped silicon region is formed of n-type silicon and the other of the first doped silicon region and the second doped silicon region is formed of p-type silicon.

11. The method as claimed in claim 9, wherein the first doped silicon region is formed to not be isolated from oxidized silicon.

12. The method as claimed in claim 9, wherein the first doped silicon region is formed to not directly contact the first die and the second die.

13. A wafer, comprising:
    a first die;
    a second die; and
    a scribe lane located between the first die and the second die,
    wherein the scribe lane includes:
        a substrate region including a doped silicon region and an undoped silicon region, the doped silicon region including a first doped silicon region of n-type silicon and a second doped region of p-type silicon, the undoped silicon region being present between the doped silicon region and the first die and the second die such that the doped silicon region does not directly contact the first die or the second die, and
        a passivation region above the substrate region.

14. The wafer as claimed in claim 13, wherein:
    the scribe lane includes a sawing blade passing region, and
    the doped silicon region is present in the sawing blade passing region.

15. The wafer as claimed in claim 13, wherein the doped silicon region includes a plurality of first doped silicon regions and second doped regions that contact each other.

16. The wafer as claimed in claim 13, wherein the doped silicon region includes a plurality of first doped silicon regions and second doped regions that are separated from each other by the undoped silicon region.

* * * * *